United States Patent
Wood et al.

(10) Patent No.: US 8,536,776 B2
(45) Date of Patent: Sep. 17, 2013

(54) LIGHT EMITTING DEVICE INCLUDING SEMICONDUCTOR NANOCRYSTALS

(75) Inventors: Vanessa Wood, Cambridge, MA (US); Matthew J. Panzer, Somerville, MA (US); Jean-Michel Caruge, New York, NY (US); Jonathan E. Halpert, Falls Church, VA (US); Moungi G. Bawendi, Cambridge, MA (US); Vladimir Bulovic, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 398 days.

(21) Appl. No.: 12/776,112

(22) Filed: May 7, 2010

(65) Prior Publication Data

US 2011/0080090 A1    Apr. 7, 2011

Related U.S. Application Data

(60) Provisional application No. 61/176,351, filed on May 7, 2009.

(51) Int. Cl.
*H01J 1/62* (2006.01)
*H01J 9/00* (2006.01)

(52) U.S. Cl.
USPC ............................................. 313/498; 445/23

(58) Field of Classification Search
USPC ................................................. 313/498–512
See application file for complete search history.

(56) References Cited

U.S. PATENT DOCUMENTS

| | | | |
|---|---|---|---|
| 5,512,131 A | | 4/1996 | Kumar et al. |
| 5,646,419 A | * | 7/1997 | McCaldin et al. ............... 257/13 |
| 6,180,239 B1 | | 1/2001 | Whitesides et al. |
| 6,251,303 B1 | | 6/2001 | Bawendi et al. |
| 6,322,901 B1 | | 11/2001 | Bawendi et al. |
| 6,518,168 B1 | | 2/2003 | Clem et al. |
| 6,576,291 B2 | | 6/2003 | Bawendi et al. |
| 6,797,412 B1 | * | 9/2004 | Jain et al. ....................... 428/690 |
| 7,253,452 B2 | | 8/2007 | Steckel et al. |
| 7,332,211 B1 | | 2/2008 | Bulovic et al. |
| 7,917,298 B1 | * | 3/2011 | Scher et al. ...................... 702/19 |
| 2004/0104399 A1 | | 6/2004 | Ou et al. |
| 2006/0157720 A1 | | 7/2006 | Bawendi et al. |
| 2006/0196375 A1 | | 9/2006 | Coe-Sullivan et al. |
| 2007/0090753 A1 | * | 4/2007 | Arakane ......................... 313/504 |
| 2007/0176162 A1 | * | 8/2007 | Kang ............................... 257/14 |
| 2008/0001167 A1 | | 1/2008 | Coe-Sullivan et al. |
| 2008/0074050 A1 | | 3/2008 | Chen et al. |

FOREIGN PATENT DOCUMENTS

| | | |
|---|---|---|
| EP | GB 2352329 | 1/2001 |
| EP | 2006921 | 12/2008 |

OTHER PUBLICATIONS

Adachi et al., Appl. Phys. Lett. 78, 1622 (2001).
Alivisatos A. P. *Science* 1996, 271, 933.
Anikeeva, P. O., et al. *Nano Lett.* 9 (2009).
Anikeeva, P. O., et al. *Phys. Rev. B* 78, 085434 (2008).
Anikeeva, P.O. et al. *Nano Lett.* 7, 2196-2200 (2007).

(Continued)

*Primary Examiner* — Joseph L Williams
(74) *Attorney, Agent, or Firm* — Steptoe & Johnson LLP (57) ABSTRACT

A light emitting device including semiconductor nanocrystals can have a unipolar construction. The semiconductor nanocrystals emit light during device operation. The size and chemical composition of the semiconductor nanocrystals can be chosen to provide desired emission characteristics. Devices that share a substrate and emit more than one color may be conveniently made.

25 Claims, 7 Drawing Sheets

(56) References Cited

OTHER PUBLICATIONS

Blackstock et al. *Surface Science* 546, 87-96 (2003).
Bolink, H.J., et al. *Appl. Phys. Lett.* 91 223501 (2007).
Bulovic et al., Semiconductors and Semimetals 64, 255 (2000).
Bulovic, V. et al., *Nature* 1996, 380, 29.
Caruge, J.-M., et al. *Nano Lett.* 6, 2991-2994 (2006).
Caruge, J.-M., et al. *NaturePhotonics* 2, 247-250 (2008).
Coe, S., et al. *Nature* 420, 800-803 (2002).
Colvin, V. L., et al. *Nature* 370, 354-357 (1994).
D'Andrade et al., MRS Fall Meeting, BB6.2 (2001).
Dabbousi et al., J. Phys. Chem. 101, 9463 (1997).
Din et al., Jpn. J. Appl. Phys. 37, 1457 (1998).
Drndić M., *J. Appl. Phys.* 92, 7498-7503, (2002).
Dur M., et al.; *J. Appl. Phys.* 1998, 83, 3176.
Empedocles, S. A.& Bawendi, M.G. *Science* 278, 2114-2117 (1997).
G. Yu et al. Applied Physics Letters 73:111-113 (1998).
Görrn, P. et al. *Appl. Phys. Lett.* 9, 063502 (2007).
Gu, G. et al., *Appl. Phys. Lett.* 1996, 68, 2606-2608.
Hanif K. M., et al.; *J. Am. Chem. Soc.* 2002, 122, 2532.
Ivanov, S.A. et al. *J. Phys. Chem.* 108, 10625-10630.
Kagan, C.R., et al. *Phys. Rev. B* 54, 8633-8643 (1996).
Keir J. P.; Wager J. F. *Annu. Rev. Mat. Sci.* 1997, 27, 223.
Kim, L., et al. *Nano Lett.* 8, 4513-4517 (2008).
Leatherdale C.A. & Bawendi M.G. *Phys. Rev. B* 63, 165315 (2001).
Levy L., et al.; *J. Phys. Chem.* 1996, 100, 18322.
Morgan, N. Y., et al. *Phys. Rev. B* 66, 075339 (2002).
Mueller, A. H. et al. *Nano Lett.* 5, 1039-1044 (2005).
Nirmal, M. et al. *Nature* 383, 802-804 (1996).
Norris D. J., et al.; *Nano Lett.* 2007, 1, 3.
Pradhan N., et al.; *J. Amer. Chem. Soc.* 2005, 127, 17528.
Pradhan N.; Peng X. *J. Amer. Chem. Soc.* 2006, 129, 3339.
Shim M.; Guyot-Sionnest P. *Nature* 2000, 407, 981.
Steckel, J.S. et al. *Angewandte ChemieInternational Edition* 45, 5796-5799 (2006).
Stouwdam, J.W. & Janssen R.A.J. *J. Mat. Chem.* 18, 1889-1894 (2008).
Thakar et al.; *Nano Lett.* 2007, 7, 3429.
Wang Y., et al.; *Solid State Comm.* 1991, 77, 33.
Yamasaki et al., Appl. Phys. Lett. 76, 1243 (2000).
Zhao, J. et al. *Nano Lett.* 6, 463-467 (2006).

* cited by examiner

LIGHT EMITTING DEVICE INCLUDING SEMICONDUCTOR NANOCRYSTALS

CLAIM OF PRIORITY

This application claims priority to provisional U.S. Patent Application No. 61/176,351 filed on May 7, 2009, which is incorporated by reference in its entirety.

FEDERALLY SPONSORED RESEARCH OR DEVELOPMENT

This invention was made with Government Support under Grant No. DMR0213282, awarded by the National Science Foundation, Grant No. FA9550-04-1-0462, awarded by the Air Force Office of Scientific Research, and Grant No. W911NF-07-D-0004, awarded by the Army Research Office. The Government has certain rights in this invention.

TECHNICAL FIELD

The present invention relates to light emitting devices including semiconductor nanocrystals.

BACKGROUND

Light-emitting devices can be used, for example, in displays (e.g., flat-panel displays), screens (e.g., computer screens), and other items that require illumination. Accordingly, the brightness of the light-emitting device is an important feature of the device. Also, low operating voltages and high efficiencies can improve the viability of producing emissive devices. In many applications, long device lifetime is desirable.

Light-emitting devices can release photons in response to excitation of an active component of the device. Emission can be stimulated by applying a voltage across the active component (e.g., an electroluminescent component) of the device. Some devices can be operated with a time-varying voltage, i.e., an alternating current; such devices can be referred to as alternating current thin-film electroluminescent (AC-TFEL) devices. The electroluminescent component can be a polymer, such as a conjugated organic polymer or a polymer containing electroluminescent moieties or layers of organic molecules. Typically, the emission can occur by radiative recombination of an excited charge between layers of a device. The emitted light has an emission profile that includes a maximum emission wavelength, and an emission intensity, measured in luminance (candelas/square meter ($cd/m^2$) or power flux ($W/m^2$)). The emission profile, and other physical characteristics of the device, can be altered by the electronic structure (e.g., energy gaps) of the material. For example, the brightness, range of color, efficiency, operating voltage, and operating half-lives of light-emitting devices can vary based on the structure of the device.

SUMMARY

In general, a light emitting device can include a plurality of semiconductor nanocrystals. Semiconductor nanocrystals can be inorganic semiconductor particles, for example, 1-15 nm in diameter, optionally decorated with organic ligands. Nanocrystals can show strong quantum confinement effects that can be harnessed in designing bottom-up chemical approaches to create complex heterostructures with electronic and optical properties that are tunable with the size and composition of the nanocrystals.

Semiconductor nanocrystals can be used as an emissive material in a light emitting device. Because semiconductor nanocrystals can have narrow emission linewidths, can be photoluminescent efficient, and emission wavelength tunable, they can be a desirable emissive material. These optical properties of the nanocrystals themselves can be influenced by selection of nanocrystals having appropriate composition, size, and configuration. Semiconductor nanocrystals can be dispersed in a liquid and are therefore compatible with thin-film deposition techniques such as spin-casting, drop-casting, and dip coating.

Semiconductor nanocrystals can be deposited on a substrate using microcontact printing. Advantageously, microcontact printing allows micron-scale or nano-scale (e.g., less than 1 mm, less than 500 µm, less than 200 µm, less than 100 µm, less than 25 µm, or less than 1 µm) patterning of features on a surface. In particular, a monolayer of semiconductor nanocrystals can be deposited by microcontact printing. In other examples, a multilayer of semiconductor nanocrystals can be deposited on a surface by ink jet printing, spin coating, dip coating, microcontact printing or other methods. The multilayer can be less than 3 microns thick, less than 2 microns thick, or less than 1 micron thick. This approach can allow a substantially dry (i.e., substantially solvent-free) application of a patterned semiconductor nanocrystal film on a substrate. A wider variety of substrates can thus be used, because the choice of substrate can be freed from constraints imposed by solubility and surface chemistry requirements.

An electroluminescent device can have a sandwich structure in which a first electrode, a first semiconductor layer, a second semiconductor layer, and a second electrode layer are stacked on an insulating substrate. To emit light of different colors, the wide band-gap material must be modified to form active color centers. One disadvantage associated with this structure is the difficulty of engineering layer composition to emit red, green and blue light side by side. The first and second semiconductor layers can have opposite polarity (i.e., one is p-type and the other n-type, forming a p-i-n device) or the same polarity (i.e., both are n-type, forming an n-i-n device; or both are p-type, forming a p-i-p device).

When semiconductor nanocrystals are included in an electroluminescent device, the device can produce light of a desired color or colors. Multiple devices that emit different colors of light can be easily produced side by side with little or no change to material processing conditions used in device fabrication.

Voltage- and current-driven light emitting devices can include solution-deposited semiconductor nanocrystals embedded in a transparent, unipolar, sputter-deposited ceramic matrix. These devices can exhibit long shelf lives and provide constant device luminance over extended operating times in air while unpackaged. In some circumstances, the devices can provide a peak luminance of 1000 $Cd/m^2$ and a luminous efficiency of 1 Cd/A from one face of a transparent device. The devices can be greater than 90%, greater than 95%, or 96% transparent across the visible part of the spectrum.

In one aspect, a light emitting device includes a first electrode; a first n-type semiconductor material adjacent to the first electrode; a second electrode; a second n-type semiconductor material adjacent to the second electrode; and an emissive layer between the first n-type semiconductor material and second n-type semiconductor material, where the emissive layer includes a plurality of semiconductor nanocrystals.

The device can further include a first electron-blocking layer between the first n-type semiconductor material and the emissive layer. The device can further include a first insulating layer between the first electron-blocking layer and the emissive layer. The device can further include a second electron-blocking layer between the second n-type semiconductor material and the emissive layer. The device can further include a second insulating layer between the second electron-blocking layer and the emissive layer.

The device can be substantially transparent to at least a portion of visible wavelengths of light. The plurality of semiconductor nanocrystals can include a first population of semiconductor nanocrystals selected to emit a single color of light, or selected to emit more than one different color of light. The plurality of semiconductor nanocrystals can be selected to produce a white light emission from the device. The first population of semiconductor nanocrystals is selected to emit visible light, or to emit infrared light. The device can be unpackaged.

The first n-type semiconductor material can include a ZTO, and the second n-type semiconductor material can, independently, include a ZTO. The device can further include a first electron-blocking layer between the first n-type semiconductor material and the emissive layer, and a first insulating layer between the first electron-blocking layer and the emissive layer. The device can further include a second electron-blocking layer between the second n-type semiconductor material and the emissive layer, and a second insulating layer between the second electron-blocking layer and the emissive layer. The device can further include a second electron-blocking layer between the second n-type semiconductor material and the emissive layer, and a second insulating layer between the second electron-blocking layer and the emissive layer. At least one of the first and second electron-blocking layers can include ZnS. At least one of the first and insulating layers can include ZnO.

In another aspect, a method of forming a device includes depositing a first n-type semiconductor material adjacent to the first electrode; depositing over the first n-type semiconductor material an emissive layer including a plurality of semiconductor nanocrystals; depositing over the emissive layer a second n-type semiconductor material; and assembling a second electrode adjacent to the second n-type semiconductor material.

The method can further include depositing a first electron-blocking layer between the first n-type semiconductor material and the emissive layer. The method can further include depositing a first insulating layer between the first electron-blocking layer and the emissive layer. The method can further include depositing a second electron-blocking layer between the second n-type semiconductor material and the emissive layer. The method can further include depositing a second insulating layer between the second electron-blocking layer and the emissive layer.

Depositing the emissive layer can include selecting a first population of semiconductor nanocrystals to emit a single color of light. Depositing the emissive layer can include selecting more than one distinct populations of semiconductor nanocrystals to emit more than one different colors of light. Depositing the emissive layer can include selecting semiconductor nanocrystals to produce a white light emission from the device.

Depositing the first n-type semiconductor material can include sputtering the first n-type semiconductor material, thereby forming a layer of the first n-type semiconductor material. Depositing the second n-type semiconductor material can include sputtering the second n-type semiconductor material, thereby forming a layer of the second n-type semiconductor material. Depositing the emissive layer can include depositing semiconductor nanocrystals by spin casting, ink jet printing, microcontact printing, electrospray, or a combination thereof. Assembling a second electrode adjacent to the second dielectric material can include sputtering to deposit the second electrode.

Depositing at least one of the first n-type semiconductor material and the second n-type semiconductor material can include include co-sputtering ZnO and $SnO_2$, thereby depositing an n-type semiconductor material including ZTO. Depositing at least one of the first n-type semiconductor material and the second n-type semiconductor material can occur in a substantially oxygen-free environment.

In another aspect, a method of generating light includes providing a device including a first electrode; a first n-type semiconductor material adjacent to the first electrode; a second electrode; a second n-type semiconductor material adjacent to the second electrode; and an emissive layer between the first n-type semiconductor material and second n-type semiconductor material, where the emissive layer includes a plurality of semiconductor nanocrystals; and applying a light-generating potential across the first electrode and the second electrode.

Light can be generated continuously for at least 1 hour, at least 2 hours, at least 5 hours, at least 10 hours, or at least 20 hours with a substantially constant luminosity, where the device is unpackaged. Light can be generated with a peak luminance of at least 10 $Cd/m^2$, at least 100 $Cd/m^2$, at least 200 $Cd/m^2$, at least 500 $Cd/m^2$, or at least 1,000 $Cd/m^2$. Light can be generated with a luminous efficiency of at least 0.1 Cd/A, at least 0.2 Cd/A, at least 0.5 Cd/A, or at least 1 Cd/A.

In another aspect, a light emitting device can include a first electrode; a first n-type semiconductor material including ZTO adjacent to the first electrode; a second electrode; a second n-type semiconductor material including ZTO adjacent to the second electrode; and an emissive layer between the first n-type semiconductor material and second n-type semiconductor material, where the emissive layer includes a plurality of semiconductor nanocrystals.

The device can further include a first electron-blocking layer including ZnS between the first n-type semiconductor material and the emissive layer; and can further include a first insulating layer including ZnO between the first electron-blocking layer and the emissive layer. The device can further include a second electron-blocking layer including ZnS between the second n-type semiconductor material and the emissive layer; and the device can further include a second insulating layer including ZnO between the second electron-blocking layer and the emissive layer.

The plurality of semiconductor nanocrystals can include a first population of semiconductor nanocrystals selected to emit a single color of light, or selected to emit more than one different color of light.

In another aspect, a light emitting device includes a first electrode; a first p-type semiconductor material adjacent to the first electrode; a second electrode; a second p-type semiconductor material adjacent to the second electrode; and an emissive layer between the first p-type semiconductor material and second p-type semiconductor material, where the emissive layer includes a plurality of semiconductor nanocrystals.

Other features, objects, and advantages of the invention will be apparent from the description and drawings, and from the claims.

DETAILED DESCRIPTION

A light emitting device can include two or more layers separating two electrodes of the device. The layers can include a dielectric layer interposed between the electrodes and an emissive layer. When a voltage is applied across the electrodes, excitons can be formed on an electroluminescent material. The excitons can then recombine to emit light. The electroluminescent material can be selected for its emissive properties, such as emission wavelength or linewidth. The electroluminescent material can be a wide band gap material.

Figure 1:
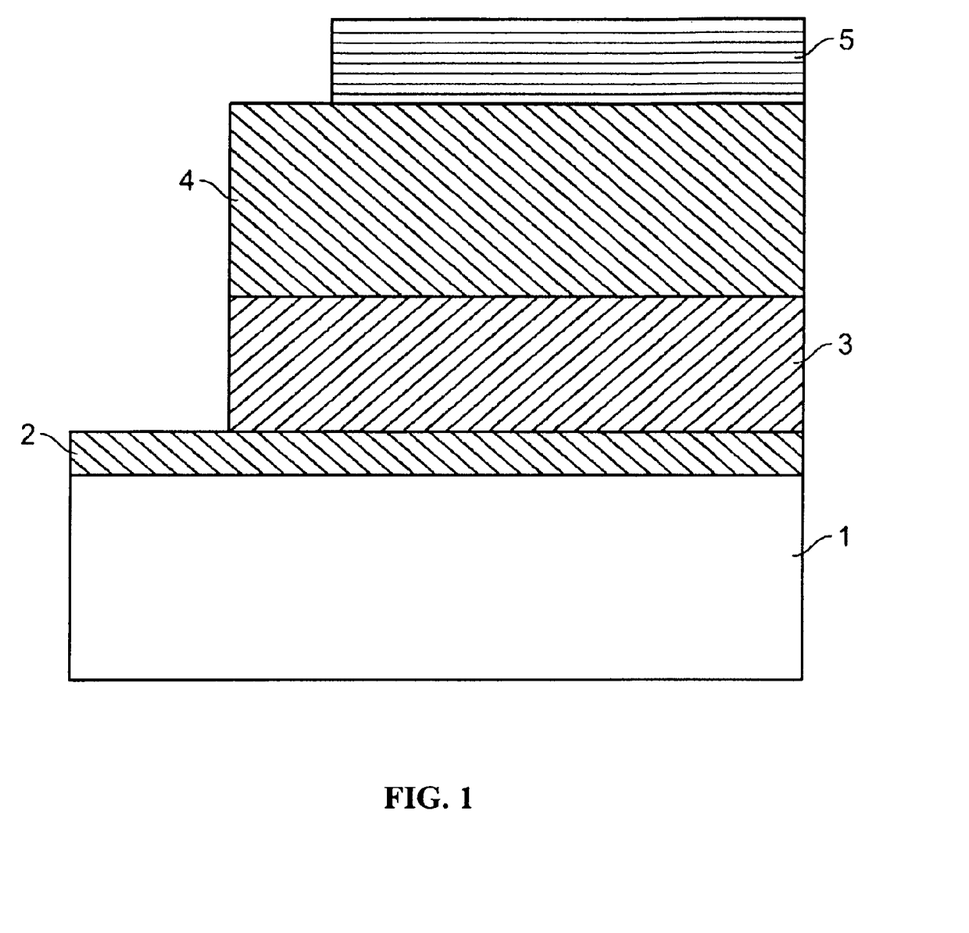
FIG. 1 is a schematic drawing depicting a light-emitting device.

A light emitting device can have a structure such as shown in FIG. 1, in which a first electrode 2, a first layer 3 in contact with the electrode 2, a second layer 4 in contact with the layer 3, and a second electrode 5 in contact with the second layer 4. First layer 3 and second layer 4 can each be a semiconductor layer, capable of functioning as an insulating layer or a charge transport layer, such as a hole transport layer, or electron transport layer. One of the electrodes of the structure is in contact with a substrate 1. Each electrode can contact a power supply to provide a voltage across the structure. Electroluminescence can be produced by the emissive layer of the heterostructure when a voltage is applied across the heterostructure. A separate emissive layer (not shown in FIG. 1) can be included between the in the device, for example between first layer 3 and second layer 4. The separate emissive layer can include a wide band gap material.

The substrate can be opaque or transparent. A transparent substrate can be used to in the manufacture of a transparent LED. See, for example, Bulovic, V. et al., *Nature* 1996, 380, 29; and Gu, G. et al., *Appl. Phys. Lett.* 1996, 68, 2606-2608, each of which is incorporated by reference in its entirety. Transparent LEDs can be used in applications such as a head-up display, as on a helmet visor or a vehicle windscreen. The substrate can be rigid or flexible. The substrate can be plastic, metal or glass. The first electrode can be, for example, a high work function conductor, such as an indium tin oxide (ITO) layer. Other first electrode materials can include gallium indium tin oxide, zinc indium tin oxide, titanium nitride, or polyaniline. The second electrode can be, for example, a low work function (e.g., less than 4.0 eV, metal, such as Al, Ba, Yb, Ca, a lithium-aluminum alloy (Li:Al), a magnesium-silver alloy (Mg:Ag); or can made of materials such as those described for the first electrode, i.e., ITO, gallium indium tin oxide, zinc indium tin oxide, titanium nitride, and polyaniline. The second electrode, such as Mg:Ag, can be covered with an opaque protective metal layer, for example, a layer of Ag for protecting the cathode layer from atmospheric oxidation; or covered with a relatively thin layer of substantially transparent ITO. The first electrode can have a thickness of about 500 Angstroms to 4000 Angstroms. The first layer can have a thickness of about 50 Angstroms to about 5 micrometers, such as a thickness in the range of 100 Angstroms to 100 nm, 100 nm to 1 micrometer, or 1 micrometer to 5 micrometers. The second layer can have a thickness of about 50 Angstroms to about 5 micrometers, such as a thickness in the range of 100 Angstroms to 100 nm, 100 nm to 1 micrometer, or 1 micrometer to 5 micrometers. The second electrode can have a thickness of about 50 Angstroms to greater than about 1000 Angstroms.

A dielectric layer can include a material selected for its insulating properties and compatibility with device manufacturing procedures. Some exemplary dielectric materials include, without limitation, a metal oxide (e.g., a silicon oxide such as $SiO_2$, an aluminum oxide such as $Al_2O_3$, or a hafnium oxide such as $HfO_2$), and a wide band gap polymer (e.g., polymethylmethacrylate). The emissive layer includes an emissive material, preferably one with a wide band gap. Zinc sulfide, for example, is a suitable material.

In some embodiments, the dielectric material and the emissive material are combined in a single material. For example, crystals of zinc sulfide can be coated or encapsulated in a dielectric material, such as a polymer. These polymer-coated crystals can serve as dielectric and emissive material together in a single material.

Advantageously, layers of inorganic semiconductor (e.g., ITO, ZTO, and ZnS) can be deposited on a substrate at a low temperature, for example, by sputtering. Sputtering is performed by applying a high voltage across a low-pressure gas (for example, argon) to create a plasma of electrons and gas ions in a high-energy state. Energized plasma ions strike a target of the desired coating material, causing atoms from that target to be ejected with enough energy to travel to, and bond with, the substrate.

The layers can be deposited on a surface of one of the electrodes by spin coating, dip coating, vapor deposition, sputtering, or other thin film deposition methods. The second electrode can be sandwiched, sputtered, or evaporated onto the exposed surface of the solid layer. One or both of the electrodes can be patterned. The electrodes of the device can be connected to a voltage source by electrically conductive pathways. Upon application of the voltage, light is generated from the device.

Microcontact printing provides a method for applying a material to a predefined region on a substrate. The predefined region is a region on the substrate where the material is selectively applied. The material and substrate can be chosen such that the material remains substantially entirely within the predetermined area. By selecting a predefined region that forms a pattern, material can be applied to the substrate such that the material forms a pattern. The pattern can be a regular pattern (such as an array, or a series of lines), or an irregular pattern. Once a pattern of material is formed on the substrate, the substrate can have a region including the material (the predefined region) and a region substantially free of material. In some circumstances, the material forms a monolayer on the substrate. The predefined region can be a discontinuous region. In other words, when the material is applied to the predefined region of the substrate, locations including the material can be separated by other locations that are substantially free of the material. In other examples, a multilayer of semiconductor nanocrystals can be deposited on a surface by ink jet printing, spin coating, dip coating, microcontact printing or other methods. The multilayer can be less than 3 microns thick, less than 2 microns thick, or less than 1 micron thick.

Microcontact printing and related techniques are described in, for example, U.S. Pat. Nos. 5,512,131; 6,180,239; and 6,518,168, each of which is incorporated by reference in its entirety. In some circumstances, the stamp can be a featureless stamp having a pattern of ink, where the pattern is formed when the ink is applied to the stamp. See U.S. Patent Application Publication No. 2006-0196375, which is incorporated by reference in its entirety.

See, for example, U.S. Patent Application Publication Nos. 2008-0001167, and 2006-0196375, and 2006-0157720, and US-2008-0074050, each of which is incorporated by reference in its entirety.

The electrical properties (such as band gaps and band offsets) of the device materials can be selected in combination with the device structure to produce a device where excitons are formed substantially on the wide band gap emissive material. The emissive material can transfer energy to an emission-altering material before light is emitted from the device. Energy transfer can occur by emission of light from the emissive material and reabsorption by the emission-altering material. Alternatively, the energy transfer can be a transfer of energy with light emission and reabsorption (such as Förster energy transfer). In either case, once the emission-altering material is in an excited state, it can emit light. In some circumstances, emission and reabsorption can be the primary method of energy transfer. When this is so, the emission-altering material need not be adjacent to the emissive material. The efficiency of Förster energy transfer, however, depends on the distance between the energy transfer partners, with smaller distances giving greater efficiency of energy transfer.

Semiconductor nanocrystals can advantageously be used as an emission-altering material. The semiconductor nanocrystals can have a broad absorption band with an intense, narrow band emission. The peak wavelength of emission can be tuned from throughout the visible and infrared regions, depending on the size, shape, composition, and structural configuration of the nanocrystals. The nanocrystals can be prepared with an outer surface having desired chemical characteristics (such as a desired solubility). Light emission by nanocrystals can be stable for long periods of time. Thin film light emitting devices incorporating semiconductor nanocrystals are described in, for example, Colvin, V. L., et al. *Nature* 370, 354-357 (1994); Zhao, J. et al. *Nano Lett.* 6, 463-467 (2006); Coe, S., et al. *Nature* 420, 800-803 (2002); Anikeeva, P. O., et al. *Nano Lett.* 9 (2009); Mueller, A. H. et al. *Nano Lett.* 5, 1039-1044 (2005); Caruge, J.-M., et al. *Nano Lett* 6, 2991-2994 (2006); Bolink, H. J., et al. *Appl. Phys. Lett.* 91 223501 (2007); Stouwdam, J. W. & Janssen R. A. J. *J. Mat. Chem.* 18, 1889-1894 (2008); and Caruge, J.-M., et al. *Nature Photonics* 2, 247-250 (2008); each of which is incorporated by reference in its entirety.

Highly efficient devices can include a monolayer of closely packed semiconductor nanocrystals sandwiched between organic charge transport layers; the high efficiency can be attributed to the concomitant excitation of the luminescent nanocrystal film via both Förster energy transfer and direct charge injection (see, e.g., Anikeeva, P. O., et al. *Phys. Rev. B* 78, 085434 (2008), which is incorporated by reference in its entirety). Because of the dominant role of Förster energy transfer in device operation, for a particular exciton-donating film, red-emitting devices operate with greater efficiency than blue devices (see, for example, Anikeeva, P. O., et al. *Nano Lett.* 9 (2009); and Anikeeva, P. O. et al. *Nano Lett.* 7, 2196-2200 (2007); each of which is incorporated by reference in its entirety). The use of molecular organic materials as the charge transport layers introduces fabrication challenges similar to those facing organic LEDs (OLEDs), specifically the need for packaging to prevent degradation by atmospheric oxygen or water vapor.

Radio frequency (RF) sputter-deposited metal oxides, which are chemically and morphologically stable in air, can be used as charge transport layers to achieve robust nanocrystal LEDs that do not require packaging (Caruge, J.-M., et al. *Nature Photonics* 2, 247-250 (2008), which is incorporated by reference in its entirety). These devices (of p-i-n configuration) require difficult balancing of hole and electron injection into the luminescent nanocrystal film, and as such can exhibit lower efficiency than state of the art organic-based nanocrystal-LEDs. Furthermore, since red, green, and blue nanocrystals can have different chemical compositions, a variety of carefully selected transport layers may be required to achieve multicolor electroluminescence of comparable efficiency and luminosity for each color.

When a nanocrystal achieves an excited state (or in other words, an exciton is located on the nanocrystal), emission can occur at an emission wavelength. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue, or to higher energies, as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) for nanocrystals that emit in the visible can be observed. IR-emitting nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

Colloidal nanocrystals can be doped with transition metals (such as Fe, Ni, Mn, Cu) and lanthanides (such as Eu, Er, Tm, Tb) to alter their electronic, optical, and/or magnetic properties. See, for example, Alivisatos A. P. *Science* 1996, 271, 933; Shim M.; Guyot-Sionnest P. *Nature* 2000, 407, 981; Levy L., et al.; *J. Phys. Chem.* 1996, 100, 18322; Hanif K. M., et al.; *J. Am. Chem. Soc.* 2002, 122, 2532; Wang Y., et al.; *Solid State Comm.* 1991, 77, 33; and Norris D. J., et al.; *Nano Lett.* 2007, 1, 3; each of which is incorporated by reference in its entirety. Light emission from doped nanocrystals can be independent of the band gap of the host material, and largely unaffected by thermal and chemical variations of the surrounding medium (see, e.g., Pradhan N., et al.; *J. Amer. Chem. Soc.* 2005, 127, 17528, which is incorporated by reference in its entirety).

The semiconductor forming the nanocrystals can include a Group II-VI compound, a Group II-V compound, a Group III-VI compound, a Group III-V compound, a Group IV-VI compound, a Group compound, a Group II-IV-VI compound, or a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. Nos. 6,322,901, 6,576,291, and 7,253,452, each of which is incorporated by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl)chalcogenide, dioxygen, an ammonium salt, or a tris(silyl)pnictide. Suitable X donors include dioxygen, bis(trimethylsilyl)selenide $((TMS)_2Se)$, trialkyl phosphine selenides such as (tri-n-octylphosphine)selenide (TOPSe) or (tri-n-butylphosphine)selenide (TBPSe), trialkyl phosphine tellurides such as (tri-n-octylphosphine)telluride (TOPTe) or hexapropylphosphorustriamide telluride (HPPTTe), bis(trimethylsilyl)telluride $((TMS)_2Te)$, bis(trimethylsilyl)sulfide $((TMS)_2S)$, a trialkyl phosphine sulfide such as (tri-n-octylphosphine)sulfide (TOPS), an ammonium salt such as an ammonium halide (e.g., $NH_4Cl$), tris(trimethylsilyl)phosphide $((TMS)_3P)$, tris(trimethylsilyl)arsenide $((TMS)_3As)$, or tris(trimethylsilyl)antimonide $((TMS)_3Sb)$. In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

Doped nanocrystals can be prepared by a method like the one described in Thakar et al.; *Nano Lett.* 2007, 7, 3429, which is incorporated by reference in its entirety. Generally, a nanocrystal of a given size and composed of a particular material can be surface doped, e.g., with a transition metal, and the nanocrystal grown to a larger size by addition of the same material. Alternatively, a nanocrystal of a given size and composed of a particular material can be coated first with a thin coating layer by exposure to coating reagents in the presence of a doping reagent, and then the coating thickness increased by exposure to coating reagents without added doping reagent. See also Alivisatos A. P. *Science* 1996, 271, 933; Shim M.; Guyot-Sionnest P. *Nature* 2000, 407, 981; Levy L., et al.; *J. Phys. Chem.* 1996, 100, 18322; Hanif K. M., et al.; *J. Am. Chem. Soc.* 2002, 122, 2532; Wang Y., et al.; *Solid State Comm.* 1991, 77, 33; Norris D. J., et al.; *Nano Lett.* 2007, 1, 3; Pradhan N., et al.; *J. Amer. Chem. Soc.* 2005, 127, 17528; and Pradhan N.; Peng X. *J. Amer. Chem. Soc.* 2006, 129, 3339, each of which is incorporated by reference in its entirety.

The core can have an overcoating on a surface of the core. The overcoating can be a semiconductor material having a composition different from the composition of the core. The overcoat of a semiconductor material on a surface of the nanocrystal can include a Group II-VI compound, a Group II-V compound, a Group III-VI compound, a Group III-V compound, a Group IV-VI compound, a Group compound, a Group II-IV-VI compound, and a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include compounds derived from the coordinating solvent used during the growth process. The surface can be modified by repeated exposure to an excess of a competing coordinating group. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal. Nanocrystal coordinating compounds are described, for example, in U.S. Pat. No. 6,251,303, which is incorporated by reference in its entirety.

More specifically, the coordinating ligand can have the formula:

wherein k is 2, 3 or 5, and n is 1, 2, 3, 4 or 5 such that k-n is not less than zero; X is O, S, S=O, SO$_2$, Se, Se=O, N, N=O, P, P=O, As, or As=O; each of Y and L, independently, is aryl, heteroaryl, or a straight or branched C$_{2-12}$ hydrocarbon chain optionally containing at least one double bond, at least one triple bond, or at least one double bond and one triple bond. The hydrocarbon chain can be optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3-5 membered heterocycloalkyl, aryl, heteroaryl, C$_{1-4}$ alkylcarbonyloxy, C$_{1-4}$ alkyloxycarbonyl, C$_{1-4}$ alkylcarbonyl, or formyl. The hydrocarbon chain can also be optionally interrupted by —O—, —S—, —N(R$^a$)—, —N(R$^a$)—C(O)—O—, —O—C(O)—N(R$^a$)—, —N(R$^a$)—C(O)—N(R$^b$)—, —O—C(O)—O—, —P(R$^a$)—, or —P(O)(R$^a$)—. Each of R$^a$ and R$^b$, independently, is hydrogen, alkyl, alkenyl, alkynyl, alkoxy, hydroxylalkyl, hydroxyl, or haloalkyl.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, or phenanthryl.

A suitable coordinating ligand can be purchased commercially or prepared by ordinary synthetic organic techniques, for example, as described in J. March, *Advanced Organic Chemistry*, which is incorporated by reference in its entirety.

Transmission electron microscopy (TEM) can provide information about the size, shape, and distribution of the nanocrystal population. Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

Individual devices can be formed at multiple locations on a single substrate to form a display. The display can include devices that emit at different wavelengths. By patterning the substrate with arrays of different color-emitting materials, a display including pixels of different colors can be formed. In some applications, the substrate can include a backplane. The backplane includes active or passive electronics for controlling or switching power to individual pixels. Include a backplane can be useful for applications such as displays, sensors, or imagers. In particular, the backplane can be configured as an active matrix, passive matrix, fixed format, direct drive, or hybrid. The display can be configured for still images, moving images, or lighting. A lighting display can provide white light, monochrome light, or color-tunable light. See, e.g., U.S. Patent Application Publication No. 2006-0196375, which is incorporated by reference in its entirety.

The device can be made in a controlled (oxygen-free and moisture-free) environment, preventing the quenching of luminescent efficiency during the fabrication process. Other multilayer structures may be used to improve the device performance.

The performance of light emitting devices can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety. Nanocrystals can be included in efficient hybrid organic/inorganic light emitting devices.

The narrow FWHM of nanocrystals can result in saturated color emission. This can lead to efficient nanocrystal-light emitting devices even in the red and blue parts of the visible spectrum, since in nanocrystal emitting devices no photons are lost to infrared and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of nanocrystals will emit light spanning a narrow range of wavelengths. A device including more than one size of nanocrystal can emit light in more than one narrow range of wavelengths. The color of emitted light perceived by a viewer can be controlled by selecting appropriate combinations of nanocrystal sizes and materials in the device. The degeneracy of the band edge energy levels of nanocrystals facilitates capture and radiative recombination of all possible excitons, whether generated by direct charge injection, energy transfer, or absorption of light.

Devices can be prepared that emit visible or infrared light. The size and material of a semiconductor nanocrystal can be selected such that the nanocrystal emits visible or infrared light of a selected wavelength. The wavelength can be between 300 and 2,500 nm or greater, for instance between 300 and 400 nm, between 400 and 700 nm, between 700 and 1100 nm, between 1100 and 2500 nm, or greater than 2500 nm.

Individual devices can be formed at multiple locations on a single substrate to form a display. The display can include devices that emit at different wavelengths. By patterning the substrate with arrays of different color-emitting semiconductor nanocrystals, a display including pixels of different colors can be formed.

In the nanocrystal electroluminescent device, an inorganic semiconductor layer such an n-type alloy of ZnO and $SnO_2$ (referred to as ZTO for zinc tin oxide) is formed on a substrate, e.g., by sputtering. A nanocrystal solution can be deposited (e.g., by spin casting, inkjet printing, microcontact printing, or drop casting) over the inorganic semiconductor layer, forming a nanocrystal layer. The nanocrystals may deposited in a layer substantially free of other materials, or alternatively, the nanocrystals may be deposited so as to be dispersed in a matrix. For example, the nanocrystals can be co-deposited with an organic polymer (such as, for example, PMMA or polyisobutylene) resulting in a layer of nanocrystals disposed in a polymer matrix. A second inorganic semiconductor layer of the same polarity as the first inorganic semiconductor layer is deposited, for example by sputtering, over the nanocrystal layer. A top electrode and protection layer can be provided by an indium tin oxide (ITO) coated glass slide; or by sputtering or otherwise depositing a suitable electrode material over the second inorganic semiconductor layer.

The device can be assembled by separately growing the two transport layers, and physically applying the electrical contacts using an elastomer such as polydimethylsiloxane (PDMS). This avoids the need for direct deposition of material on the nanocrystal layer.

The device can be thermally treated after application of all of the transport layers. The thermal treatment can further enhance injection of charges into the nanocrystals, as well as eliminate the organic capping groups on the nanocrystals. The instability of the capping groups can contribute to device instability.

The device can have an n-i-n structure or a p-i-p structure. Some examples of n-i-n device structures depicted schematically in FIG. 2. Some p-type semiconductor materials suitable for use in a p-i-p device include NiO, CuO, and $WO_3$.

The applied voltage used for light generation can be an AC voltage or DC voltage. A DC voltage can be supplied by DC voltage generator, including, for example, a battery, a capacitor, or a rectified AC voltage. An AC voltage can be supplied by an AC voltage generator which produces a voltage waveform, such as, for example, a square wave. The waveform can have a frequency of between 0.01 Hz and 100 kHz, 10 Hz and 1 MHz, 250 Hz and 100 kHz, or 500 Hz and 10 kHz. The average voltage can be between 2 and 15 volts, or 3 and 8 volts. The percentage of duty cycle used is the calculated as one hundred multiplied by the average voltage divided by the maximum voltage. The percentage of duty cycle is the relative time in an on/off cycle (in %) during which the voltage is on. The frequency, duty cycle, and peak voltage can be adjusted to optimize light output and stability from the device. Some applications of a duty cycle are described, for example, in G. Yu et al. Applied Physics Letters 73:111-113 (1998), incorporated herein by reference in its entirety. For example, the AC voltage waveform can be a 50% duty cycle at 5 V and 1 kHz, which has a maximum voltage of 5 volts, a frequency of 1 kHz, and an average voltage of 2.5 volts. In this way, a low average operating voltage can improve the operating half-lives of the devices.

A display unit can be made using such electroluminescent devices comprising a layer including a nanocrystal layer and wide band gap material between two insulating layers and conductive layers, wherein the light emitting layer generating light of different colors is formed by choosing and patterning nanocrystal layers of desired energy structure and composition. Thus, a multicolor display can be realized.

EXAMPLES

Unlike previously reported nanocrystal LEDs that placed nanocrystal films between p-type and n-type charge transport layers, forming a p-i-n device structure, a nanocrystal film can be arranged between n-type charge transport layers, forming an n-i-n device. ZTO can be used for both n-type charge transport layers.

Figure 2A:
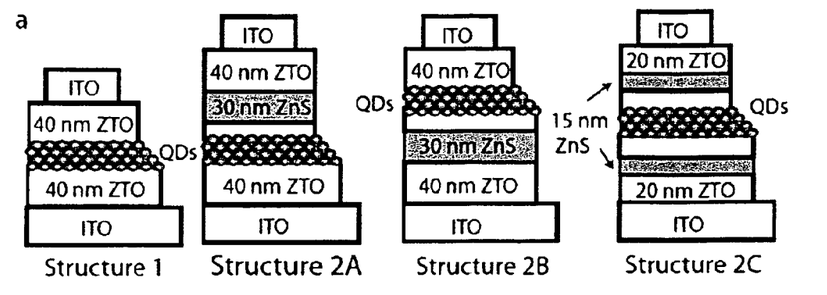
FIG. 2A is a series of schematic drawings depicting a light-emitting devices.
Figure 2B:
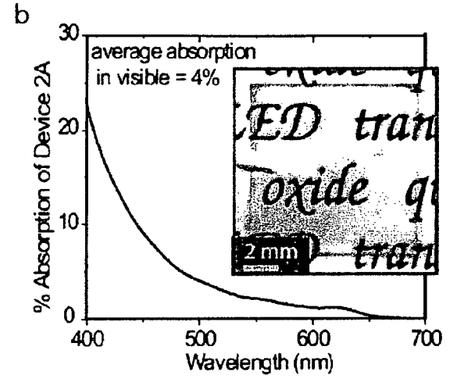
FIG. 2B is a graph depicting optical properties of a light emitting device; the inset photograph is of a light emitting device placed over text to illustrate transparency.
Figure 2C:
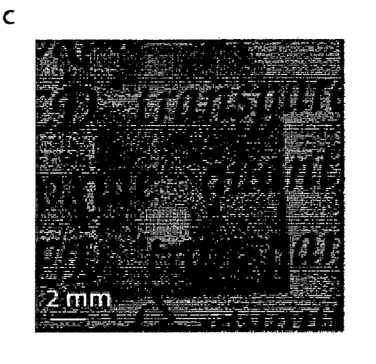
FIG. 2C is a photograph is of an illuminated light emitting device placed over text.
Figure 2D:
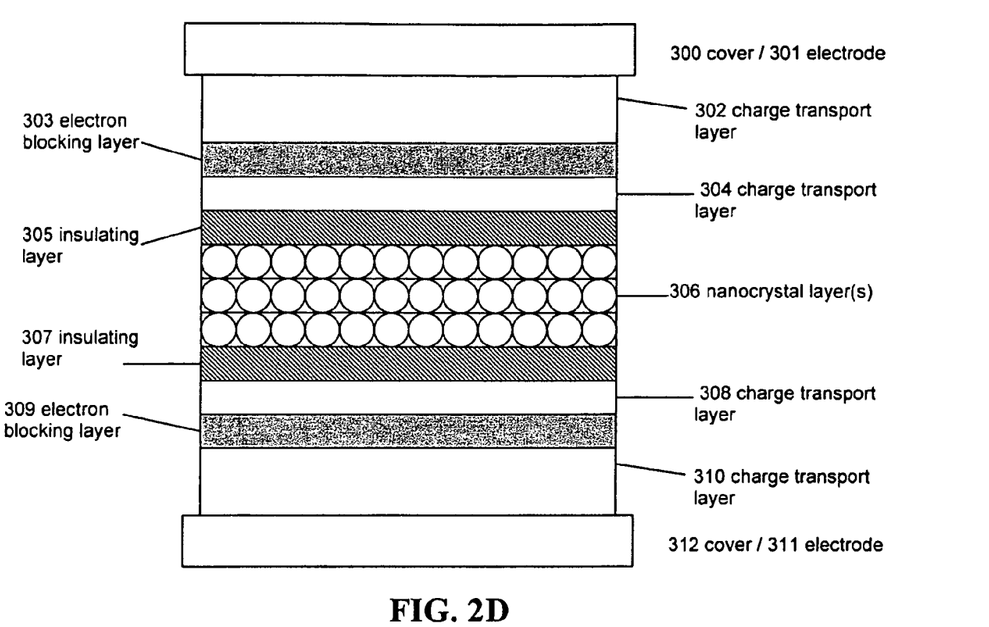
FIG. 2D is a schematic drawing depicting a light-emitting device.

Two types of device structures (Structure 1 and Structures 2A-2D), differentiated by the presence of at least one ZnS layer in Structures 2A-2C, are depicted schematically in FIG. 2A. FIG. 2D is a schematic depiction of a light emitting device having an electrode 301 optionally protected by cover 300. Electrode 301 is in electrical contact with charge transport layer 302. Optional electron blocking layer 303, optional charge transport layer 304, and optional insulating layer 305 are optionally disposed between charge transport layer 302 and nanocrystal layer(s) 306. Optional insulating layer 307, optional charge transport layer 308 and optional electron blocking layer 309 are optionally disposed between nanocrystal layer(s) 306 and charge transport layer 310. Charge transport layer 310 is in electrical contact with electrode 311, which is optionally protected by cover 312. Applying a suitable light generating voltage across the two electrodes results in light emission from the device.

Device fabrication began with ZTO deposition on top of commercial indium tin oxide (ITO)-coated glass from Thin Film Devices. There is considerable flexibility over the processing conditions that can be used for the bottom ZTO layer; however, to ensure that both ZTO layers (on either side of the nanocrystal layer), a previously developed method for depositing ZTO on top of nanocrystals by co-sputtering the ZnO and $SnO_2$ in a pure Ar environment was used. Instead of introducing $O_2$ during the sputtering process, which can damage the nanocrystal layer and thereby reduce its photoluminescence, the conductivity of the ZTO film was controlled by adjusting the relative ZnO and $SnO_2$ deposition rates.

Figure 3:
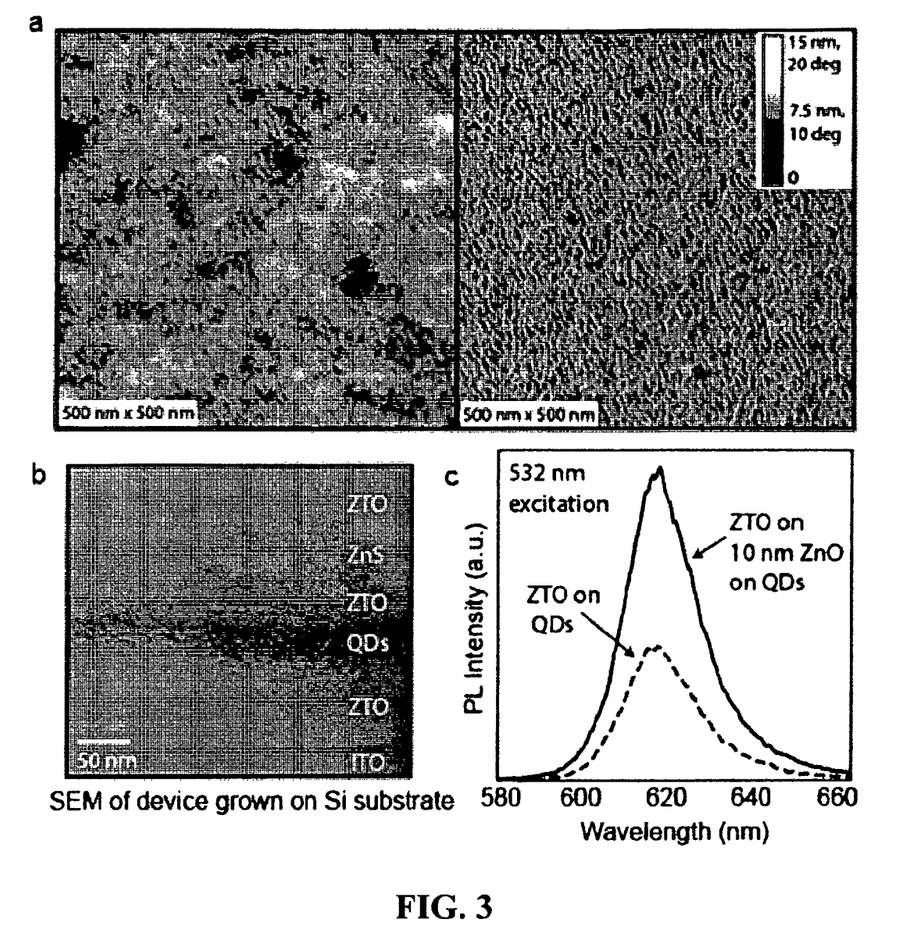
FIG. 3A depicts AFM image and phase data for an incomplete light emitting device.
FIG. 3B is an SEM image of a cross section of a light emitting device.
FIG. 3C is a graph depicting optical properties of nanocrystals in different environments.

Nanocrystals were either synthesized in-house or purchased commercially (QD Vision, Inc.). Red CdSe/ZnS or green CdZnSe/CdZnS core/shell nanocrystals were used. The red nanocrystals had a photoluminescence (PL) quantum yield (QY) of (90±5)%, while the green nanocrystals had a PL QY of (70±5)%. See, for example, Dabbousi, B. O. et al. *J. Phys. Chem. B.* 101, 9463-9475 (1997); Ivanov, S. A. et al. *J. Phys. Chem.* 108, 10625-10630 (2004); and Steckel, J. S. et al. *Angewandte ChemieInternational Edition* 45, 5796-5799 (2006); each of which is incorporated by reference in its entirety. Absorption measurements performed on the nanocrystals in solution and cross-sectional atomic force microscopy (AFM) of spun-cast films were used to calibrate the concentration of nanocrystals in solution and to achieve the desired nanocrystal layer thicknesses. Nanocrystals were spun from chloroform at 2000 rpm. Cross sectional and topography AFM scans showed that nanocrystal layers were 5 or 6 nanocrystals thick across the entire sample. FIG. 3A shows AFM topography and phase images of a multilayer film of red nanocrystals spun onto ZTO. The darker areas in the topography scan indicate areas where a thickness of 1 or 2 nanocrystals were missing; however, the phase image revealed that while small regions (<50 nm$^2$) existed where there were fewer layers of nanocrystals, the nanocrystal film completely covered the bottom ZTO layer.

The top ZTO film was deposited using identical target preparation and growth conditions as used for the bottom ZTO layer. A 150 nm thick ITO top contact was then sputter-deposited through a shadow mask to define 10 pixels, each of which was 1 mm×2 mm in size. In Structure 1, ZTO films ranging in thickness from 20 to 80 nm were used; however, the Structure 1 results reported here are only for those devices with 40 nm thick ZTO films on either side of the nanocrystal layer.

Structures 2A-2C integrated a layer of insulating wide band gap RF sputter-deposited ZnS into Structure 1. The total ZnS thickness was 30 nm; in the case of Structure 2C, two 15 nm thick ZnS layers were used. Each ZnS layer was located 15 nm away from the nanocrystal layer to ensure layer homogeneity.

In FIG. 3A, topographical (left) and phase (right) atomic force microscopy (AFM) images of red CdSe/ZnS nanocrystals spin coated onto 40 nm of ZTO on ITO show the type of complete and ordered film necessary for efficient device operation. FIG. 3B shows a cross sectional scanning electron microscope (SEM) image of device Structure 2A, which was grown on a Si substrate to facilitate sample cleaving. The sample was cleaved across the top contact using a diamond blade. The cleaved surface was cross-section polished for 5 hours and SEM images are taken with an electron energy of 10 keV and a working distance of 3 mm. The SEM revealed continuous ceramic layers and a 50 nm thick nanocrystal region. FIG. 3C displays photoluminescence spectra a thin film of nanocrystals excited with a λ=532 nm laser, chosen so that only the nanocrystals, and not the metal oxides, were optically excited.

Consistency between measurements of different samples was ensured by using a microscope objective to uniformly illuminate and collect luminescence from the entire sample area. The film of nanocrystals was coated with either a 40 nm thick layer of sputter deposited ZTO (dashed line) or 10 nm of ZnO followed by 40 nm of ZTO (solid line). The addition of 10 nm of insulating ZnO doubled the PL response of the nanocrystal\ film.

Transparency measurements were made on a device fabricated on a 1×1 inch polished quartz substrate. Shadow masking steps were eliminated to achieve complete films across the entire area. Transmission and reflection were measured with a CARY 500i spectrophotometer.

Figure 4:
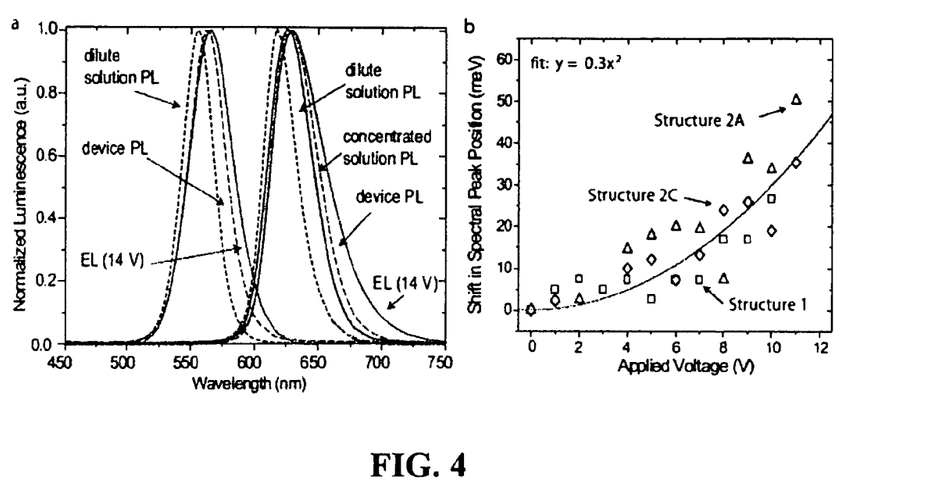
FIG. 4A is a graph depicting optical properties of nanocrystals and of light emitting devices.
FIG. 4B is a graph depicting optical properties light emitting devices at different operating voltages.

For the PL spectra in FIG. 4A, the excitation source was a 408 nm laser, and the PL emission was collected at off-normal incidence with an Acton Research spectrograph. For the PL measurements in FIG. 4B and FIG. 6, a chopped Ar-ion laser (514 nm) excited the sample, which was biased using a Keithley 2602 source meter, and the PL signal was detected with a photodetector and lock-in-amplifier. The combined PL and EL spectral data from this measurement was collected using a spectrograph.

Figure 5A:
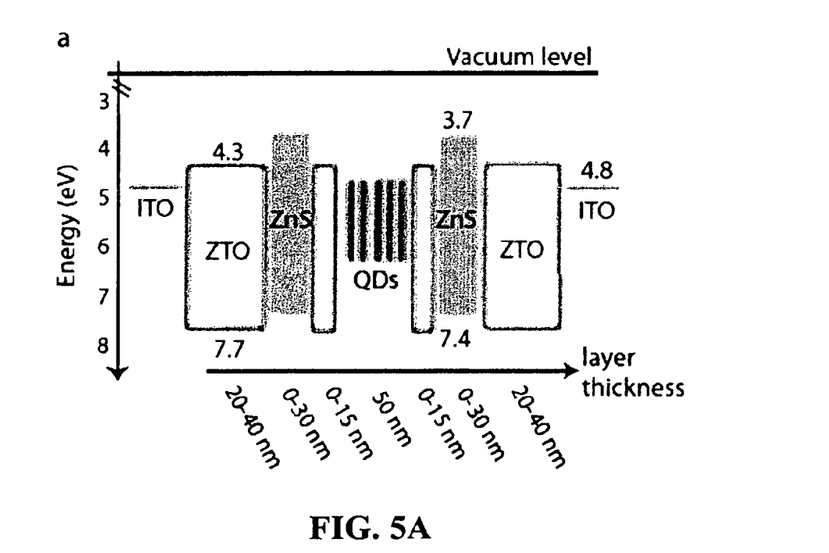
FIG. 5A is a schematic representation of semiconductor band energy levels for different materials used in light emitting devices.
Figure 5B:
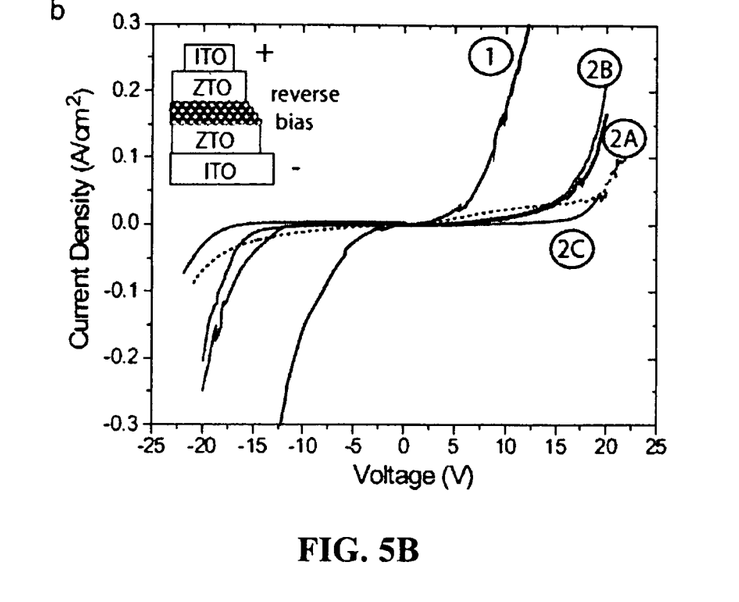
FIGS. 5B-5C are graphs depicting operational properties of light emitting devices under different conditions.
Figure 5C:
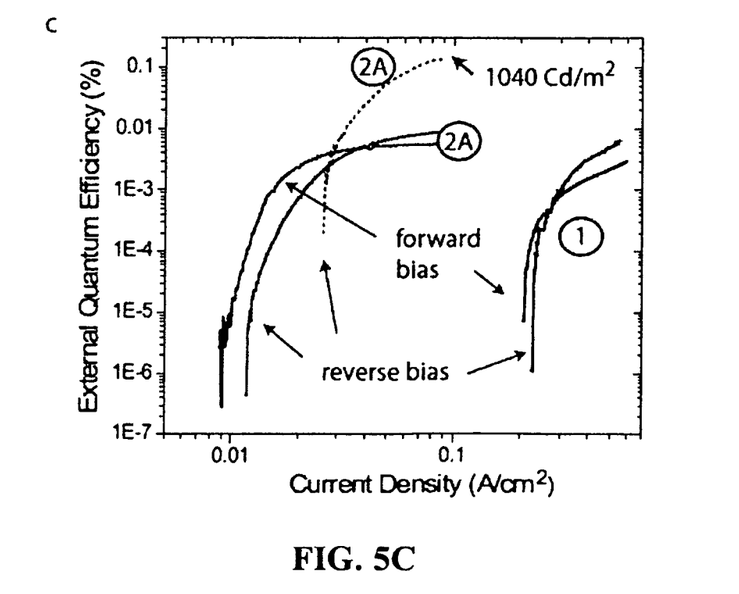
Figure 7:
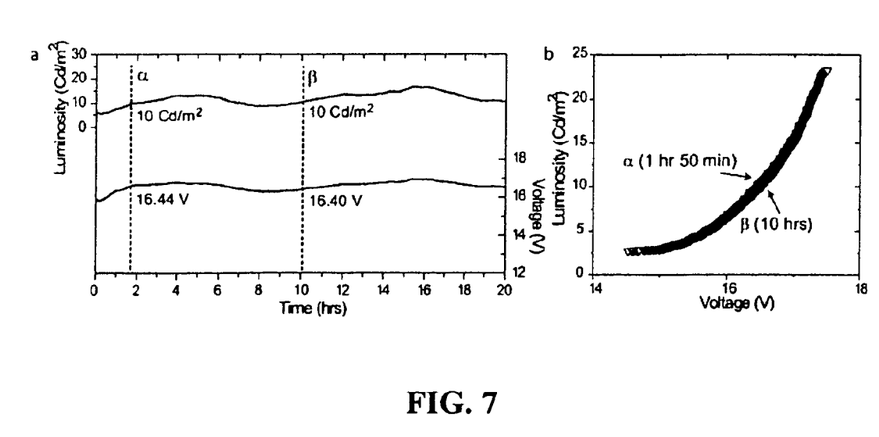
FIGS. 7A-7B are graphs depicting operational properties of a light emitting device over an extended period of time.

For EL measurements in FIG. 5C and FIG. 7, the sample was biased in DC with a Labview-controlled Keithley 2602 source meter. AC bias was applied with a HP 3254A function generator. Luminescence emission was collected with a Newport silicon photodetector.

The n-i-n devices were optically transparent and provided electroluminescence (EL) from nanocrystals having different emission colors. For Structure 2A, an absorption of less than 4% at wavelengths above λ=500 nm was measured (see FIG. 2B), with most of the absorption due to the 50 nm thick nanocrystal layer. There was negligible absorption from the ceramic thin films, all of which had band gaps greater than 3 eV. The inset photograph in FIG. 2B of the completed device provides a visual indication of device transparency. A photograph of a Structure 2A device biased at 18 V highlights the uniform EL over the entire pixel area (FIG. 2C).

The EL spectra for green and red nanocrystal Structure 1 devices biased at 14 V demonstrated that a unipolar, n-i-n structure can provide multiple color emission from the same device structure (FIG. 2A) where the EL was due entirely to nanocrystal emission. The redshift and broadening of the EL spectra in comparison to the dilute nanocrystal solution PL spectra (dashed black lines) can be explained by well-characterized interactions in nanocrystal ensembles (Kagan, C.R., et al. *Phys. Rev. B* 54, 8633-8643 (1996); Leatherdale C. A. & Bawendi M. G. *Phys. Rev. B* 63, 165315 (2001); and Empedocles, S. A. & Bawendi, M. G. *Science* 278, 2114-2117 (1997), each of which is incorporated by reference in its entirety). The PL spectrum of the concentrated solution of red nanocrystals used for the nanocrystal layer deposition (solid black line) matched the device PL spectrum (dashed red line). This suggested that nanocrystal proximity, through effects such as energy transfer and dielectric dispersion, can explain the red-shift and some of the broadening. At 14 V applied bias, an increase in the full width half-maximum (FWHM) between the device PL and EL spectra of 7 nm for the red device and 8 nm for the green device was observed. FIG. 4B shows the redshift in peak position of the PL spectra as a function of applied voltage across the device. The redshift displayed a quadratic dependence for all measured structures (structure 1, structure 2A, and structure 2C). This red shift in peak position and spectral broadening as a function of applied voltage were consistent with the increased LO-phonon coupling expected with larger exciton polarization in the presence of an electric field and thus represent a manifestation of the quantum confined Stark Effect in ensembles of nanocrystals.

The schematic energy band diagram for the devices FIG. 5A was determined using ultraviolet photoelectron spectroscopy and optical absorption measurements on nanocrystal and metal oxide films.

Ultraviolet photoelectron spectroscopy (UPS) was used to determine the ionization energy (IE) of the inorganic semiconductor layers and nanocrystal layers. The measured inorganic semiconductor layers (10 nm thick) were deposited on conductive ITO using the same conditions as in device fabrication. To enable UPS measurements of nanocrystals, a method was developed for depositing a monolayer of nanocrystals on a conductive substrate that did not involve chemical treatment of the nanocrystal layer (see, e.g., Colvin, V. L., et al. *J. Amer. Chem. Soc.* 114, 5221-5230 (1992), which is incorporated by reference in its entirety). A film of template stripped Au was prepared following the previous work of Blackstock et al. *Surface Science* 546, 87-96 (2003), which is incorporated by reference in its entirety. The nanocrystal solution was spin cast onto a parylene-coated polydimethylsiloxane (PDMS) stamp and contact printed onto the Au substrate leaving a single monolayer of QDs on top of the Au surface. See, for example, Kim, L., et al. *Nano Lett.* 8, 4513-4517 (2008), which is incorporated by reference in its entirety. The samples were stored in an inert $N_2$ environment prior to loading into an Omicron Surface Analysis system. Both Helium I (21.2 eV) and Helium II (40.8 eV) lines from a He-discharge lamp were used for sample excitation.

Measured ionization energies were as follows: ZTO, (7.7±0.1) eV; ZnS, (7.4±0.2) eV; and CdSe/ZnS nanocrystals, (6.9±0.2) eV. The 6.9 eV measurement for the CdSe/ZnS nanocrystals likely represented an average of the ZnS shell and CdSe core contributions to the valence states, which is in agreement with our UPS measurements of ZnS thin films (7.4 eV) and CdSe cores (6.6 eV). The band diagram in FIG. 5A shows the ZnS shell and CdSe core energy levels separately.

The electron affinity of the materials was calculated by adding the band gap to the measured ionization energy. The band gap of the inorganic semiconductors was determined by measuring the absorption onset of layers grown on quartz using a CARY 500i spectrophotometer. The band gap of the nanocrystal core was calculated from PL measurements with an additional 0.15 eV added to account for the exciton binding energy in CdSe nanocrystals. The band gap of the ZnS shell was assumed to be similar to the thin film value. A proposed mechanism of unipolar device operation is described below. The electron affinity of ZnS is (0.6±0.2) eV lower than that of ZTO, indicating that the ZnS shell on the nanocrystals and the ZnS layers in Structures 2A, 2B, and 2C served as electron blocking layers. When a voltage was applied across the device structure, electrons were injected into the n-type ZTO and accumulated at the first ZnS barrier encountered, either a ZnS shell of a nanocrystal, or a sputtered ZnS layer, depending on the device structure and bias direction. This caused most of the voltage applied to the device to be dropped across the nanocrystal layer (in the case of Structure 1) or across both the ZnS layer and the nanocrystal layer (in the case of Structures 2A, 2B, and 2C). The large electric field generated across the nanocrystal layer can be sufficient to extract an electron from the valence band of a nanocrystal, leaving behind a hole. An electron from a neighboring nanocrystal (or from ZTO) can then couple with this hole to form an exciton on the nanocrystal; the exciton can undergo radiative recombination. To achieve steady state electroluminescence, a sufficiently large electric field must be maintained across the nanocrystal film by way of charge accumulation in the device. At the same time, a sufficiently high steady state current through the device must also be sustained to facilitate electron transport. If there are insufficient energy barriers for electrons to accumulate, the voltage drop across the nanocrystal layer could be inadequate for extraction of an electron from the nanocrystal valence band. If the number of electrons available to recombine with the holes created during nanocrystal ionization is too low (i.e., if there is insufficient current flow), nanocrystal charging may occur, which will quench luminescence and lead to a further decrease in the device current. See, e.g., Nirmal, M. et al. *Nature* 383, 802-804 (1996); Drndié M., et al. *J. Appl. Phys.* 92, 7498-7503, (2002); Morgan, N. Y., et al. *Phys. Rev. B* 66, 075339 (2002); each of which is incorporated by reference in its entirety. Efficient operation of unipolar nanocrystal light emitting devices therefore require control and balance over electron pile-up and transport, determined in large part by device structure, material, engineering and operating conditions.

Figure 6:
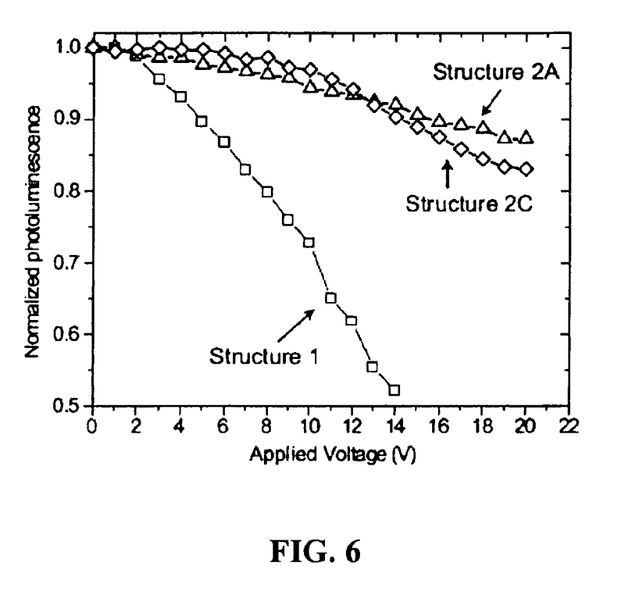
FIG. 6 is a graph depicting operational properties of light emitting devices under different conditions.

The addition of at least one ZnS layer in the device structure improved device performance by limiting nanocrystal charging. Photoluminescence (PL) quenching in the nanocrystal layer due to an applied voltage was measured. This measurement provided an indication of the number of Auger nonradiative recombination and exciton dissociation events due to nanocrystal charging or due to the presence of an electric field across the nanocrystal layer. FIG. 6 shows that the PL quenching for Structure 1 was significantly greater than for a device with a ZnS layer (Structure 2A or 2C). Since a certain minimum voltage drop across the nanocrystals was required for device operation, it was assumed that device Structures 1, 2A, and 2C all exhibited similar degrees of exciton dissociation. Therefore, the differences observed in PL quenching can be attributed to a greater amount of charging in Structure 1. The slightly larger amount of PL quenching in Structure 2C compared to Structure 2A can be explained by the fact that in forward bias, electrons encounter a 15 nm thick ZnS layer following injection in Structure 2C; but a 30 nm thick layer in Structure 2A. The thinner ZnS layer in Structure 2C is a weaker electron blocking layer that allows for more nanocrystal charging.

The devices operated stably in air without packaging, permitted by the environmental stability of the ZTO layers (Görrn, P. et al. *Appl. Phys. Lett.* 9, 063502 (2007), which is incorporated by reference in its entirety) and the unipolar device operating mechanism. All device measurements presented here were performed in ambient laboratory conditions. Repeated J-V and EQE measurements recorded every week over the course of 40 days on devices stored in air showed stable luminescent response. See FIG. 7. This long shelf life suggests the possibility for extended operation in ambient conditions. An understanding of the device operating mechanism allowed the choice of favorable bias conditions for extended testing. A device held under constant DC bias exhibited gradual charging of the nanocrystal layer, manifested by a corresponding decrease in device current over time. See, e.g., Drndié M., et al. *J. Appl. Phys.* 92, 7498-7503; (2002); and Morgan, N. Y., et al. *Phys. Rev. B* 66, 075339 (2002); each of which is incorporated by reference in its entirety. Device Structure 1 no longer exhibited EL after approximately 5 minutes at constant applied bias due to insufficient current through the device. Structure 2A, in which the nanocrystal charging occurs at a slower rate due to the presence of the ZnS layer, exhibited EL for approximately 45 minutes when forward biased in a constant voltage mode. Extended lifetime testing on Structure 2A was therefore run in a constant current mode, with voltage and luminescence measured in 5 second intervals. A device with an average EQE was selected for testing, so as to ensure representative results. FIG. 7A shows luminescence as a function of time during 20 hours of continuous device operation. The overlap onto a single curve of the 14,400 luminosity and voltage data points from panel A FIG. 7B showed that for a given voltage and current, at any point during the 20 hours of testing, the device exhibited the same luminosity. This indicated that an unpackaged device did not degrade over 20 hours of continuous operation in air.

An optimized device structure, incorporating 10 nm thick, insulating layers of RF sputter-deposited ZnO directly adjacent to the nanocrystal film achieved 0.15% external quantum efficiency (EQE). The presence of insulating layers reduced the amount of luminescence quenching due to free carriers present in the conductive ZTO. FIG. 6 shows that there was 50% less PL quenching when a 10 nm ZnO film was inserted between the nanocrystals and the ZTO.

Other embodiments are within the scope of the following claims.

What is claimed is:

1. A light emitting device comprising:
   a first electrode;
   a first semiconductor material adjacent to the first electrode;
   a second electrode;
   a second semiconductor material adjacent to the second electrode; and
   an emissive layer between the first semiconductor material and the second semiconductor material, wherein the emissive layer includes a plurality of semiconductor nanocrystals, wherein the semiconductor nanocrystals are colloidally grown, and wherein the first semiconductor material and the second semiconductor material have the same polarity.

2. The light emitting device of claim 1, wherein the first semiconductor material and the second semiconductor material are each n-type semiconductor materials.

3. The light emitting device of claim 2, further comprising a first electron-blocking layer between the first n-type semiconductor material and the emissive layer.

4. The light emitting device of claim 2, wherein the first n-type semiconductor material includes a ZTO or the second n-type semiconductor material includes a ZTO.

5. The light emitting device of claim 4, further comprising a first electron-blocking layer between the first n-type semiconductor material and the emissive layer, and a first insulating layer between the first electron-blocking layer and the emissive layer.

6. The light emitting device of claim 5, further comprising a second electron-blocking layer between the second n-type semiconductor material and the emissive layer, and a second insulating layer between the second electron-blocking layer and the emissive layer.

7. The light emitting device of claim 5, further comprising a second electron-blocking layer between the second n-type semiconductor material and the emissive layer, and a second insulating layer between the second electron-blocking layer and the emissive layer.

8. The light emitting device of claim 7, wherein at least one of the first and second electron-blocking layers includes ZnS.

9. The light emitting device of claim 7, wherein at least one of the first and insulating layers includes ZnO.

10. The light emitting device of claim 3, further comprising a first insulating layer between the first electron-blocking layer and the emissive layer.

11. The light emitting device of claim 3, further comprising a second electron-blocking layer between the second n-type semiconductor material and the emissive layer.

12. The light emitting device of claim 10, further comprising a second insulating layer between the second electron-blocking layer and the emissive layer.

13. The light emitting device of claim 1, wherein the device is substantially transparent to at least a portion of visible wavelengths of light.

14. The light emitting device of claim 1, wherein the plurality of semiconductor nanocrystals includes a first population of semiconductor nanocrystals selected to emit a single color of light.

15. The light emitting device of claim 14, wherein the plurality of semiconductor nanocrystals includes more than one distinct populations of nanocrystals selected to emit more than one different color of light.

16. The light emitting device of claim 15, wherein the plurality of semiconductor nanocrystals are selected to produce a white light emission from the device.

17. The light emitting device of claim 14, wherein the first population of semiconductor nanocrystals is selected to emit visible light.

18. The light emitting device of claim 14, wherein the first population of semiconductor nanocrystals is selected to emit infrared light.

19. The light emitting device of claim 1, wherein the device is unpackaged.

20. The light emitting device of claim 1, wherein the first semiconductor material and the second semiconductor material are each p-type semiconductor materials.

21. The light emitting device of claim 1, wherein each of first semiconductor material and the second semiconductor material is an inorganic semiconductor material.

22. A method of forming a device, comprising:
   depositing a first n-type semiconductor material adjacent to the first electrode;
   depositing over the first n-type semiconductor material an emissive layer including a plurality of semiconductor nanocrystals, wherein the semiconductor nanocrystals are colloidally grown;
   depositing over the emissive layer a second n-type semiconductor material; and
   assembling a second electrode adjacent to the second n-type semiconductor material.

23. A method of generating light comprising:
   providing a device including a first electrode; a first n-type semiconductor material adjacent to the first electrode; a second electrode; a second n-type semiconductor material adjacent to the second electrode; and an emissive layer between the first n-type semiconductor material and second n-type semiconductor material, wherein the emissive layer includes a plurality of semiconductor nanocrystals, and wherein the semiconductor nanocrystals are colloidally grown; and
   applying a light-generating potential across the first electrode and the second electrode.

24. The method of claim 23, wherein light is generated continuously for at least 20 hours with a substantially constant luminosity, and wherein the device is unpackaged.

25. A light emitting device, comprising:
   a first electrode;
   a first n-type semiconductor material including ZTO adjacent to the first electrode;
   a second electrode;
   a second n-type semiconductor material including ZTO adjacent to the second electrode; and
   an emissive layer between the first n-type semiconductor material and second n-type semiconductor material, wherein the emissive layer includes a plurality of semiconductor nanocrystals, and wherein the semiconductor nanocrystals are colloidally grown.

* * * * *